(12) United States Patent
Shinde et al.

(10) Patent No.: US 7,071,715 B2
(45) Date of Patent: Jul. 4, 2006

(54) PROBE CARD CONFIGURATION FOR LOW MECHANICAL FLEXURAL STRENGTH ELECTRICAL ROUTING SUBSTRATES

(75) Inventors: Makarand S. Shinde, Livermore, CA (US); Richard A. Larder, Livermore, CA (US); Timothy E. Cooper, Discovery Bay, CA (US); Ravindra V. Shenoy, Dublin, CA (US); Benjamin N. Eldridge, Danville, CA (US)

(73) Assignee: FormFactor, Inc., Livermore, CA (US)

( * ) Notice: Subject to any disclaimer, the term of this patent is extended or adjusted under 35 U.S.C. 154(b) by 1 day.

(21) Appl. No.: 10/771,099

(22) Filed: Feb. 2, 2004

(65) Prior Publication Data

US 2005/0156611 A1    Jul. 21, 2005

Related U.S. Application Data

(60) Provisional application No. 60/537,324, filed on Jan. 16, 2004.

(51) Int. Cl.
  *G01R 31/02* (2006.01)
  *G01R 31/26* (2006.01)
  *H05K 7/02* (2006.01)
  *H01R 12/04* (2006.01)

(52) U.S. Cl. ............... 324/754; 324/758; 324/761; 361/760; 439/66

(58) Field of Classification Search ............... 324/754, 324/750–765
See application file for complete search history.

(56) References Cited

U.S. PATENT DOCUMENTS

| | | | |
|---|---|---|---|
| 6,483,328 B1 * | 11/2002 | Eldridge et al. | 324/754 |
| 6,509,751 B1 | 1/2003 | Mathieu et al. | 324/754 |
| 6,690,185 B1 * | 2/2004 | Khandros et al. | 324/758 |
| 2004/0239350 A1 * | 12/2004 | Nagar et al. | 324/754 |

OTHER PUBLICATIONS

U.S. Appl. No. 09/527,931, filed Mar. 17, 2000, Mathieu et al.

* cited by examiner

*Primary Examiner*—Vinh Nguyen
*Assistant Examiner*—Emily Y Chan
(74) *Attorney, Agent, or Firm*—Thomas A. Ward

(57) ABSTRACT

A mechanical support configuration for a probe card of a wafer test system is provided to increase support for a very low flexural strength substrate that supports spring probes. Increased mechanical support is provided by: (1) a frame around the periphery of the substrate having an increased sized horizontal extension over the surface of the substrate; (2) leaf springs with a bend enabling the leaf springs to extend vertically and engage the inner frame closer to the spring probes; (3) an insulating flexible membrane, or load support member machined into the inner frame, to engage the low flexural strength substrate farther away from its edge; (4) a support structure, such as support pins, added to provide support to counteract probe loading near the center of the space transformer substrate; and/or (5) a highly rigid interface tile provided between the probes and a lower flexural strength space transformer substrate.

12 Claims, 6 Drawing Sheets

PROBE CARD CONFIGURATION FOR LOW MECHANICAL FLEXURAL STRENGTH ELECTRICAL ROUTING SUBSTRATES

PRIORITY CLAIM TO PROVISIONAL APPLICATION

This Patent Application claims priority to U.S. Provisional Patent Application No. 60/537,324, entitled "Probe Card Configuration For Low Mechanical Flexural Strength Electrical Routing Substrates," filed Jan. 16, 2004.

BACKGROUND

1. Technical Field

The present invention relates in general to a configuration of a test system for testing integrated circuits on a wafer. More particularly, the present invention relates to a probe card mechanical support configuration for probe cards with low mechanical flexural strength electrical routing substrates.

2. Related Art

With an increased size of wafers, a corresponding increase in size and complexity of test system probe cards for testing the wafers occurs. With the larger wafers, probe card substrates in the wafer test system are typically larger and designed to support more probes, or spring contacts, to connect to and test more integrated circuits (ICs) on the wafers. The larger probe cards with added probes typically result in more bending loads on the probe cards.

While increased wafer sizes are driving larger probe card configurations with a higher probe density, there is a similar move toward use of low flexural strength materials in the probe cards. The move to low flexural strength materials is a result of the need for improved electrical performance of the probe card being demanded by increases in semiconductor device complexity, and the increase in density of ICs per unit area on a wafer being tested. To meet the electrical performance requirements, materials and manufacturing techniques selected for a space transformer substrate supporting probes results in thinner, lower strength configurations. Greater flexing of the probe card substrate is further caused by the increased probe count (load) created with the increased IC density when additional spring contacts of the probe card contact a wafer being tested.

FIG. 1, for reference, shows a simplified block diagram of a test system using a probe card for testing ICs on a semiconductor wafer. The test system includes a test controller 4 connected by a communication cable 6 to a test head 8. The test system further includes a prober 10 made up of a stage 12 for mounting a wafer 14 being tested, the stage 12 being movable to contact the wafer 14 with probes 16 on a probe card 18. The prober 10 includes the probe card 18 supporting probes 16 which contact ICs formed on the wafer 14.

In the test system, test data is generated by the test controller 4 and transmitted through the communication cable 6, test head 8, probe card 18, probes 16 and ultimately to ICs on the wafer 14. Test results are then provided from ICs on the wafer back through the probe card 18 to the test head 8 for transmission back to the test controller 4. Once testing is complete, the wafer is diced up to separate the ICs.

Test data provided from the test controller 4 is divided into the individual tester channels provided through the cable 6 and separated in the test head 8 so that each channel is carried to a separate one of the probes 16. The channels from the test head 8 are linked by connectors 24 to the probe card 18. The connectors 24 can be zero insertion force (ZIF) flexible cable connectors, pogo pins, or other connector types. The probe card 18 then links each channel to a separate one of the probes 16.

FIG. 2 shows a cross sectional view of components of the probe card 18. The probe card 18 is configured to provide both electrical pathways and mechanical support for the spring probes 16 that will directly contact the wafer. The probe card electrical pathways are provided through a printed circuit board (PCB) 30, an interposer 32, and a space transformer 34. Test data from the test head 8 is provided through flexible cable connectors 24 typically connected around the periphery of the PCB 30. Channel transmission lines 40 distribute signals from the connectors 24 horizontally in the PCB 30 to contact pads on the PCB 30 to match the routing pitch of pads on the space transformer 34. The interposer 32 includes a substrate 42 with spring probe electrical contacts 44 disposed on both sides. The interposer 32 electrically connects individual pads on the PCB 30 to pads forming a land grid array (LGA) on the space transformer 34. The LGA pad connections are typically arranged in a regular multi-row pattern. Transmission lines 46 in a substrate 45 of the space transformer 34 distribute signal lines from the LGA to spring probes 16 configured in an array. The space transformer substrate 45 with embedded circuitry, probes and connection points is referred to as a probe head.

Mechanical properties for components providing support for the electrical pathways are dictated by the electrical requirements, since components on a wafer being tested typically operate at a very high frequency. The mechanical support for such a substrate should provide the following:

1. Control of deflection and stress of the space transformer substrate 45.
2. Control of the lateral position for space transformer substrate 45.
3. Precision leveling for space transformer substrate 45.
4. Control of the mechanical compression for the interposer (32) electrical contacts establishing electrical connection between space transformer substrate (45) and PCB (30).
5. Electrical isolation of all unique and bussed electrical circuit structures.

Mechanical support for the electrical components is provided by a drive plate 50, bracket (Probe Head Bracket) 52, inner frame (Probe Head Frame) 54, interposer 32, and leaf springs 56. The drive plate 50 is provided on one side of the PCB 30, while the bracket 52 is provided on the other side and attached by screws 59. The leaf springs 56 are attached by screws 58 to the bracket 52. The interposer 32 includes two pairs of alignment pins 41 and 43 located in diagonally opposite corners. Pins 43 on the bottom of the interposer are aligned to precision alignment holes in the frame 54 while those on the top align to precision holes in the PCB 30. The positions of the interposer pins 41 and 43 and the alignment holes in the PCB 30 and frame 54 control the lateral motion and hence the alignment of LGA contact pads on the substrate 45 to those on the PCB 30 via the interposer springs 44. The frame 54 further includes horizontal extensions 60 for supporting the space transformer 34 within its interior walls. The bracket 52 and frame 54 provided around the outside edges of the space transformer 34 maintain lateral position control. The probe springs 44 of the interposer 32 then provide a mechanical force separating the PCB 30 and space transformer 34 while holding the frame 54 against the leaf springs 56.

Mechanical components for leveling include four brass spheres (two are shown as 66 and 68) that contact the space transformer 34 near each corner. The brass support spheres provide a point contact outside the periphery of the LGA of the space transformer 34 to maintain isolation from electrical components. Leveling of the substrate is accomplished by adjustment of these spheres through the use of advancing screws (two screws 62 and 64 are shown), referred to as the leveling pins. The leveling pins 62 and 64 are screwed through supports 65 in the drive plate 50 and on both sides of the PCB 30.

Leveling pins 62 and 64 are adjustable to push on the space transformer 34 for both leveling of the space transformer substrate, and to potentially compensate for a substrate which is not planar, or bowed. For leveling, pushing on substrate 45 provided by the leveling pins 62 and 64 will prevent a slight deviation from level from causing spring probes 16 on one side of the space transformer substrate 45 from contacting the wafer, while excessive force is applied between the spring probes 16 and wafer on the other side. For non-planar, bowed or malformed substrates, pushing by leveling pins 62 and 64 can serve to compensate for the malformation. For space transformer substrates with surfaces that are not parallel or planar relative to each other, the leveling pins 62 and 64 are adjusted so that the surface containing the probes is parallel to the wafer surface. For bowed space transformer substrates, pushing provided by leveling pins 62 and 64 at the edges of the substrate can help straighten the bowed shape to some degree. With larger substrates more likely to bow, it is desirable to provide more support structure to compensate for the bowing, such as that described in U.S. Pat. No. 6,509,751 entitled "Planarizer for a Semiconductor Contactor," which is incorporated herein by reference.

In the past, wafers have been smaller and the number of spring probes on a space transformer have been limited. Thus, a "prober" needed to reposition the wafer to make multiple contacts to the probe card so that all ICs on the wafer could be tested. Typical space transformer substrates used in the construction of wafer probing cards have been relatively rigid (high flexural strength) and the control of deflection and stress has been made possible using the probe card structure shown in FIG. 2

With space transformers having a larger surface area and more pins to test larger wafers requiring fewer touch downs, the space transformer substrates may crack or flex out of a level planar shape due to either forces applied from the interposer, or bending forces resulting from probing. A typical space transformer substrate 45 is constructed from relatively rigid multi-layered ceramic. Using components such as the interposer 32, leveling pins 62 and 64, and frame 54 configured as shown in FIG. 2 leveling has been provided using these rigid ceramic substrates with limited stress. The frame 54 prevents flexure of the substrate in response to the interposer 32, but does nothing to deal with the bending force due to probing, as the space transformer substrate 45 is pushed away from the frame 54 when probing the wafer. With more flexible substrates, it would be desirable to provide increased support to prevent flexing due to interposer forces, as well as bending forces applied during probing.

In the future, softer more flexible substrates such as thin organic based laminates, or membranes may be used in probe cards that have extremely low or relatively no flexural rigidity. It would be desirable to provide a mechanical support configuration for a probe card substrate so that these very low flexural stiffness/strength substrates can be supported without experiencing excessive deflection or stress.

SUMMARY

In accordance with the present invention, a mechanical support configuration for a probe card is provided which provides increased support for a low flexural stiffness/strength substrate.

Five components are modified in accordance with the present invention to provide additional mechanical support and leveling of the probe head, enabling use of low flexural stiffness/strength substrates. The five components include: (1) a frame having an increased length horizontal extension; (2) leaf springs with bends enabling the leaf springs to extend vertically and engage the frame closer to the spring probes; (3) an insulating flexible membrane, or load support member machined into the probe head frame, is added to engage the space transformer substrate farther away from its edge; (4) additional support structure, such as leveling pins are added to provide support near the center of the space transformer substrate; and (5) a highly rigid interface tile is provided between the probes and a lower flexural strength space transformer substrate.

The first modification is an increase in the length of horizontal extensions from the frame, the increased length providing metal support extending out farther over the space transformer substrate than previous frame extensions. The increased horizontal extension reduces the amount of force on the edge of the space transformer substrate, distributing the force out over the space transformer substrate to prevent cracking or flexing of a larger substrate.

The second modification is to the leaf springs, and includes providing bends in the leaf springs to enable them to extend vertically from the bracket. With such bends, the leaf spring is attached by screws to the bracket on one end with the bends enabling the other end of the leaf spring to make spring contact at a point on the frame vertically closer to the spring probes. The bends enable the bracket to be recessed from the frame so that screws holding the leaf springs do not extend vertically close to the probe springs. Bends to vertically extend the leaf springs further enable spring force to be applied farther away from the edge of the space transformer towards the center of the substrate to prevent flexing or cracking of larger space transformer substrates.

The third modification includes using flexible membranes, or providing a load support member on the horizontal extension of the frame enabling the frame to engage the space transformer substrate at a point where forces are applied away from the edge of the space transformer substrate to prevent flexing or cracking of larger substrates. The purpose of the horizontal extension is to provide support to the substrate right above the primary area where the interposer springs apply force on the bottom of the probe head. This results in the space transformer substrate being sandwiched between the interposer springs and the rigid support that the extended frame provides. The flexible membranes are provided between the space transformer substrate and frame to effectively create a variable load support member so that the frame contacts the space transformer substrate at a point away from its peripheral edge. Use of different size membranes enables the contact position of the load support to be easily moved or adjusted to locate the load support contact area at a point on the substrate where flexing forces to the space transformer substrate are minimized. The flexible membrane is further made from a polymer material that provides electrical isolation between the metal frame and electrical components on the space transformer substrate. The load support member can be machined into the frame, but the electrical insulation properties and flexibility of changing the load support contact location using the flexible membrane will not be provided.

For the fourth modification, additional support structure is added to contact near the center of the space transformer substrate, providing additional support in the substrate center to prevent flexing or bending. The added support structure can be provided using support pins, such as leveling pins, with gimble spheres directly contacting the substrate, or alternatively by a similar support pin holding an elastomer pad against the substrate, or a support pin contacting a high strength metal support member attached to the space transformer substrate. To prevent electrical contact between the central support structure and LGA pads on the space transformer substrate, routing is modified in the space transformer so that no LGA pads are in an area where center supports contact the space transformer. In one embodiment, discrete components such as isolation capacitors are provided where LGA pads are removed. To accommodate the removed LGA pads, the interposer is modified to have spring contacts rearranged to correspond with new LGA pad locations on the space transformer substrate. The interposer is further modified to include openings so that central support pins can pass through the interposer to contact the space transformer substrate. The central support structure can serve to compensate for bowing of a space transformer substrate. The central support further provides support on the back of the substrate during wafer testing to prevent the space transformer from bending or cracking under probe force.

For the fifth modification, a highly rigid interface tile is provided between the probes and a lower flexural strength space transformer substrate. Without the rigid interface tile, with a low flexural strength space transformer substrate, "floating" contacts are created when excessive loading of the probes depresses the probes into the substrate. The highly rigid tile distributes the probe loading, preventing mechanical damage to such a low flexural strength space transformer substrate. The rigid tile contains straight feed through vias connecting the probes to the space transformer, while horizontal routing is provided in the less rigid space transformer.

BRIEF DESCRIPTION OF THE DRAWINGS

Further details of the present invention are explained with the help of the attached drawings in which.

DETAILED DESCRIPTION

Figure 1:
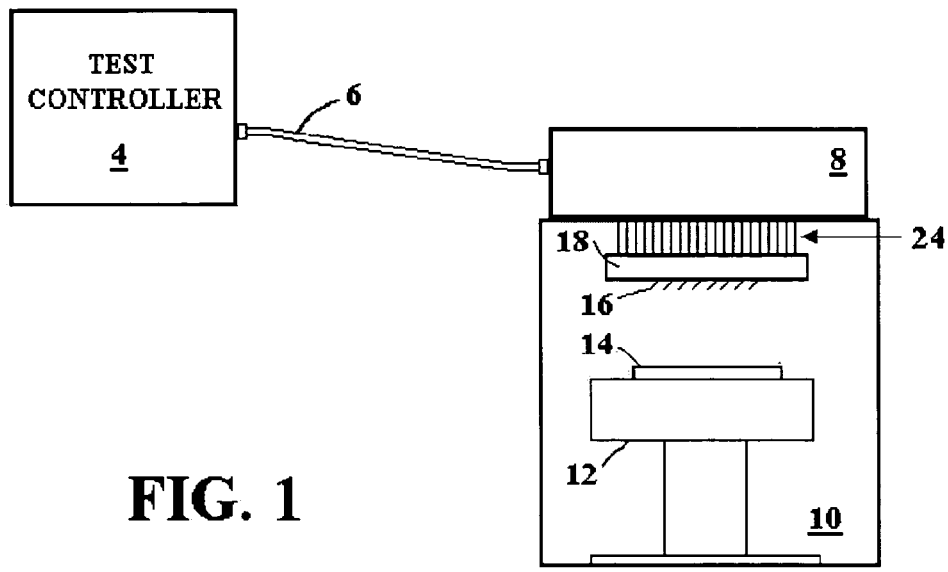
FIG. 1 shows a block diagram of components of a typical wafer test system.
Figure 2:
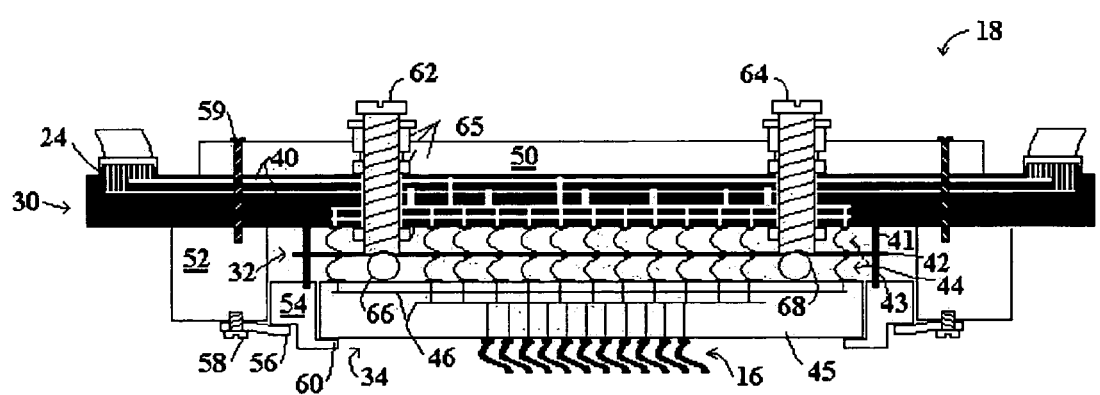
FIG. 2 is a cross sectional view of a conventional probe card for the wafer test system of FIG. 1.
Figures 3, 4:
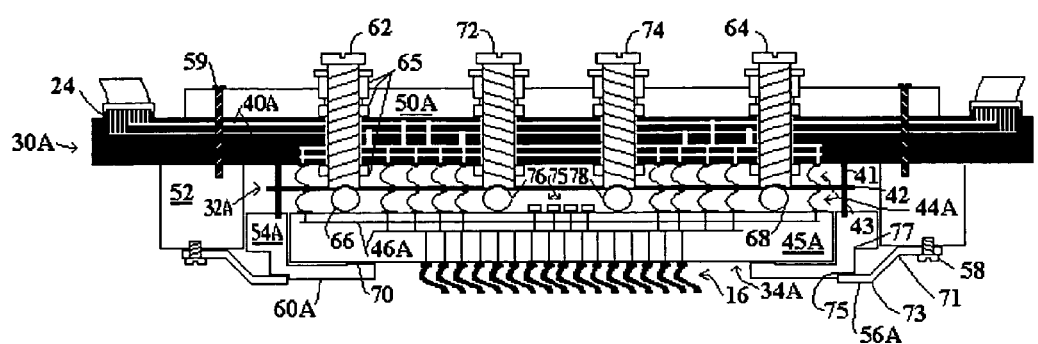
FIG. 3 is a cross sectional view of a probe card for a wafer test system in accordance with the present invention.
FIG. 4 is a cross sectional view of a probe card for a wafer test system in accordance with the present invention modified from FIG. 3 to add flexible support membranes.

FIG. 3 is a cross sectional view of a probe card for a wafer test system with modifications made in accordance with the present invention to provide additional mechanical support for low flexural stiffness/strength substrates. The probe card of FIG. 3 includes components providing electrical pathways, similar to the conventional probe card of FIG. 2, including a printed circuit board (PCB) 30A, an interposer 32A, and a space transformer 34A. The probe card of FIG. 3 further includes mechanical support for the electrical components, similar to the conventional probe card of FIG. 2, including a drive plate 50A, frame (Probe Head Frame) 54A, bracket (Probe Head Bracket) 52, and leaf springs 56A. Components carried over from FIG. 2 are similarly numbered in FIG. 3, with modified components including the letter "A" after the reference number.

Modifications to the probe card of the present invention contemplate space transformer substrates possessing limited flexural strength. The substrates of particular interest are regarded as rigid on inspection, but in response to probe loads they will deform. The probing process requires cyclic loading on the substrates, which could lead to electrical failure as traces fatigue inside the substrates. Suitable wiring substrates include polymer materials such as polyimide, Br resin, FR-4, BCB, epoxies, or other organic materials know in the art. Substrates can also include ceramics composed of alumina, silicon nitrides, low temperature co-fired ceramics, and also insulated metal core materials such as copper-invar-copper.

A first modification includes increasing the length of horizontal extension 60A on the frame 54A relative to the horizontal extension 60 as shown in FIG. 3. The increased length horizontal extension 60A provides a metal support extending out farther over the space transformer substrate 45A than with the previous frame 54. The increased horizontal extension reduces the amount of force provided on the edge of the space transformer substrate 45A, distributing the force out over the space transformer substrate 45A to prevent cracking or flexing of a larger substrate. Conventional horizontal extensions covered less than 10% of the area of the space transformer substrate. The modified horizontal extension 60A of FIG. 3 preferably covers 70% or more of the area of the space transformer substrate.

The second modification is to the leaf springs 56A to include bends 71 and 73. The bends 71 and 73 enable the leaf spring 56A to extend vertically as well as horizontally from the bracket 52. With such bends 71 and 73, the leaf springs 56A are attached by screws 58 to the bracket 52 on one end with the bend enabling the other end of the leaf spring 56A to make spring contact at a point 75 on the frame 54A vertically closer to the spring probes 16 than contact area 77 used in the configuration of FIG. 2. The bends 71 and 73 enable the bracket 52 to be recessed from the frame 54A so that the screws 58 holding the leaf springs 56A do not extend vertically close to the probe springs 16. The bends 71 and 73 vertically extend the leaf springs 56A to further enable spring force to be applied on the frame 54A so that forces are applied farther away from the edge of the space transformer substrate 45A to prevent flexing or cracking of larger substrates.

The third modification, in one embodiment, includes machining a load support member 70 on the frame 54A. The load support member 70 extends vertically from the horizontal extension 60A of the frame 54A to contact the space transformer substrate 45A at a point where forces are applied away from a peripheral edge of the substrate 45A to prevent flexing or cracking of larger substrates.

The third modification, in another embodiment, includes the use of flexible membranes 80 and 82 provided between the space transformer substrate 45A and the frame 54B, as shown in FIG. 4. Other components carried over from FIG. 3 to FIG. 4 are similarly labeled in FIG. 4. The flexible membranes 80 and 82 effectively create the load support member 70 of FIG. 3 so that the frame 54B contacts the space transformer substrate 45A at a point away from its edge. A first membrane 80 conforms to the shape of the horizontal extension 60A of the frame 54B, while the second membrane 82 has a more limited size to effectively provide the load support member 70 of FIG. 3. The second membrane 82 will adhere to the first membrane 80 for support. Use of different sizes for the membrane 82 enables the position of the load support to be easily moved or adjusted to locate the load support in an area on the substrate where forces causing flexing of the space transformer 34A are minimized.

In accordance with an embodiment of the present invention, the flexible membranes 80 and 82 are made from a polymer film material to provide electrical isolation between the metal frame 54B and electrical components on the space transformer substrate 45A. As an alternative to separate membranes, a single membrane can be formed by bonding the two thinner polymer membrane layers 80 and 82 together as a single membrane such that the inner portion of the surface of the membrane is thicker than the outer portion. As a further alternative, a single membrane 82 could be used without the membrane 80.

Use of the polymer film provides electrical isolation of the substrate 45A from the metal frame 54B. With the load support member 70 of FIG. 3 machined into the metal frame 54B, electrical isolation properties and flexibility of changing the load support area using different sized flexible membranes 82 will not be provided. If the membranes are not desired, however, in one embodiment, the flexible membranes 80 and 82 are used to determine the location of the metal load support member 70 of FIG. 3. To determine an optimum location for the metal load support member, different sized flexible membranes 82 are used and the flexibility of the substrate 45A measured for each. Once an optimum membrane 82 is selected, its location is used to locate where the metal load support member 70 is machined into the frame 54A of FIG. 3.

For the fourth modification, additional support structure is added to contact near the center of the space transformer substrate, providing additional support in the substrate center to prevent flexing or bending. In one embodiment the additional support is provided using two additional support pins 72 and 74 and spheres 76 and 78 (likely made of brass) contacting near the center of the space transformer substrate 45A. Although the support pins 72 and 74 and spheres 76 and 78 are shown as separate, in one embodiment they are combined to form support pins with rounded ends. As a further alternative, the support pins 72 and 74 can be provided with flat ends when a gimble point contact with the space transformer substrate is not an issue.

To prevent electrical contact between the spheres 76 and 78 and pads of the LGA on the space transformer substrate 45A, routing of lines 46A is modified in the space transformer 34A relative to FIG. 2 so that no pads are provided in an area where the two added spheres 76 and 78 make contact. Likewise, the interposer 32A is modified to have spring contacts 44A rearranged to correspond with new pad locations on the space transformer substrate. The interposer 32A is further modified to include openings so that the two pins 72 and 74 can pass through the center of the interposer 32A to contact the spheres 76 and 78 against the space transformer substrate 45A.

In practice the probe card would likely be assembled and leveling performed by first adjusting the planarity of the space transformer 34A using peripheral leveling pin screws 62 and 64. Once the space transformer substrate 45A is planar, central support pin screws 72 and 74 are advanced into contact with the substrate 45A to stabilize the space transformer 34A in response to the probe loads. Adjustment of the screws 72 and 74 further enables compensation for any bowing of the substrate.

Removal of the LGA pads near the center of the space transformer to provide for the central support pins 72 and 74 enables addition of discrete components 75 to the substrate. To improve performance of the probe card assembly, the discrete components 75 are preferably decoupling capacitors. Decoupling capacitors serve to compensate for line capacitance between the tester and the probes. Line capacitance results in signal delays, as well as noise in the test signals provided through probes 16 to and from a wafer.

Figure 7:
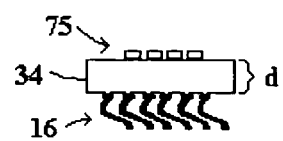
FIG. 7 shows a cross sectional view of a portion of a probe card with isolation capacitors illustrating how space transformer substrate thickness "d" affects isolation.

Using decoupling capacitors, performance is improved by minimizing the setting distance from the capacitors to the probes. FIG. 7 illustrates that minimizing the distance "d" between decoupling capacitors 75 and probes 16 on the space transformer substrate 34 will improve performance, but potentially weaken the substrate. Backside support provided by central support pins 72 and 74 during loading the probes 16 becomes necessary when the distance "d" becomes small.

Figure 5:
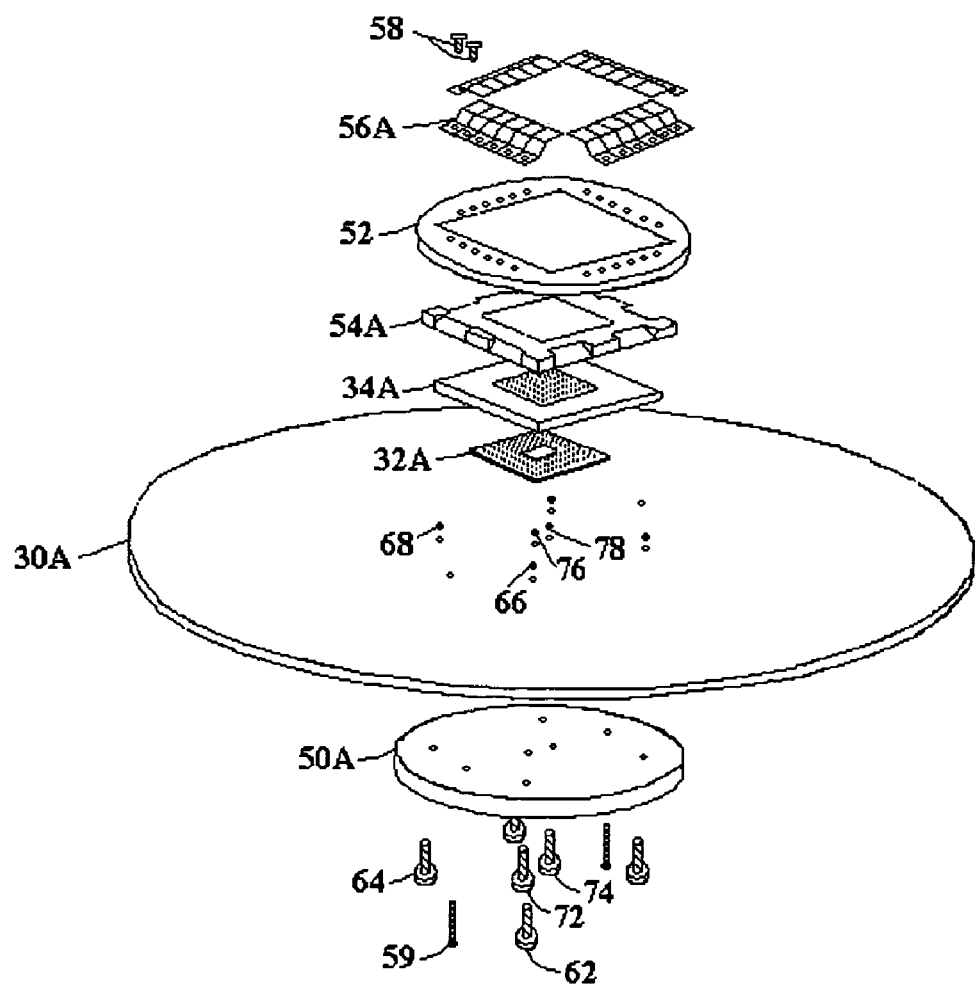
FIG. 5 is an exploded assembly view of components of the probe card of FIG. 3.
Figure 6:
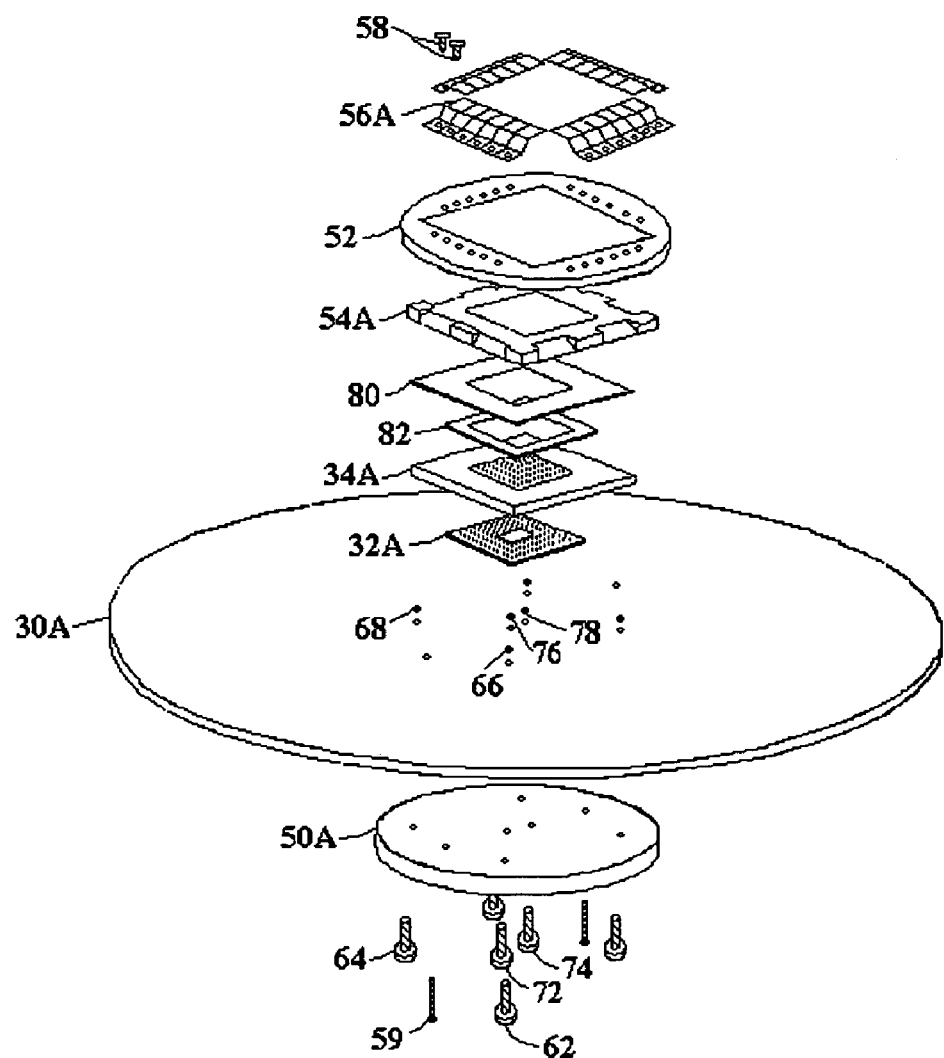
FIG. 6 is an exploded assembly view of components of the probe card of FIG. 4.

FIG. 5 is an exploded assembly view of components of the probe card of FIG. 3. FIG. 6 is an exploded assembly view of components of the probe card of FIG. 4. The configuration of FIG. 6 is modified from FIG. 5 by including the two membranes 80 and 82. The probe card assembly of FIG. 5 uses a load support member 70 (facing down in FIG. 5 and not shown) machined into the frame 54A, rather than membranes 80 and 82.

Referring to both FIG. 5 and FIG. 6, as shown, the back plate 50A is attached to the PCB 30A and bracket 52 using two screws 59. Four leveling screws, including screws 62 and 64, are provided through the back plate 50A and PCB 30A to four spheres including spheres 66 and 68, near the corners of the space transformer substrate 34A. Note that the cross sectional drawings of FIG. 3 and FIG. 4 are cut in an uneven rather than linear plane through FIGS. 5 and 6 to illustrate two corner leveling screws 62 and 64, as well as the newly added central support screws 72 and 74 provided to contact spheres 76 and 78 near the center of the space transformer substrate 34A. As shown in FIGS. 5 and 6, the central support screws 72 and 74 pass through the back plate 50A, the PCB 30A, and unlike screws 62 and 64, through an opening in the interposer 32A. In FIG. 5, the frame 34A is provided directly over the space transformer substrate 34A, the frame 34A fitting inside the bracket 52. The leaf springs 56A are attached by screws 58 to the bracket 52. Two screws 58 are shown for reference, although additional screws 58 (not shown) are provided around the entire periphery to attach the leaf springs 56A. In FIG. 6, the frame 34 is separated from the space transformer substrate by the membranes 80 and 82.

Figure 8A:
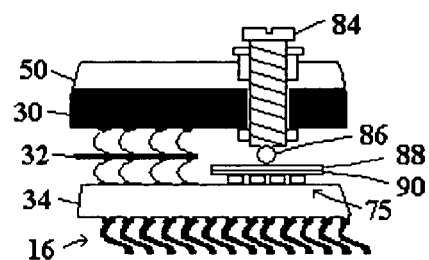
FIG. 8A shows an alternative probe card configuration where central support is provided for a space transformer using an elastomer pad.
Figure 8B:
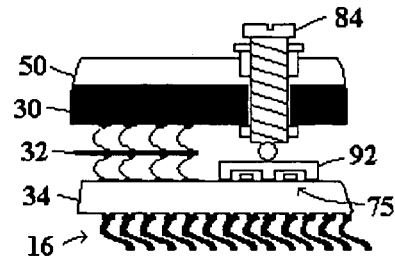
FIG. 8B shows an alternative probe card configuration where central support is provided by a rigid central support structure attached to the space transformer.

Although FIGS. 3–6 illustrate one embodiment where backside support is provided by one or more support pin screws 72 and 74, other embodiments are available as illustrated in FIGS. 8A–8B. The embodiment of FIG. 8A includes a support pin 84 which may be screwed through supports in the back plate 50 and PCB 30 to push against a gimble sphere 86. The sphere 86 then forms a swivel contact with a metal plate 88 provided over a high-density elastomer pad 90. The elastomer pad 90 then contacts discrete elements 75 provided on the space transformer 34. The elastomer pad 90 provides electrical isolation of the elements 75 from the metal plate 88. Using the support configuration shown in FIG. 8A, a single leveling pin 84 can transfer force through the plate 84 to provide a leveling force over a large area of the space transformer 34. Further, the elastomer support structure of FIG. 8A assures electrical isolation from the discrete elements 75, although use of the elastomer pad directly contacting the space transformer substrate can be provided if discrete elements 75 are not desired.

FIG. 8B illustrates another embodiment for support structure including a support pin 84 which may be screwed through supports in the back plate 50 and PCB 30 to push against a gimble sphere 86 which then contacts a rigid support member 92 attached to the back side of space transformer 34. The rigid support structure 92 can have openings as shown to provide for discrete elements 75 such as capacitors, or be provided as a flat plate without such openings. The highly rigid structure 92 can be metal, or a ceramic material. The high strength member 92 can serve to prevent the excessive loads created by the spring probes 16 contacting a wafer from causing mechanical damage to the space transformer made of reduced flexural strength materials. The support pin 84 can be adjusted to further compensate for spring probe loading on the support member 92 when the probes 16 contact a wafer.

Figure 9:
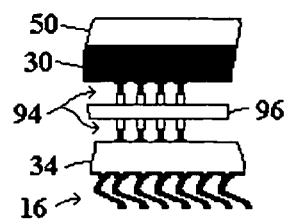
FIG. 9 is a cross sectional view of an alternative probe card configuration using pogo pins on both sides of a substrate in place of an interposer.
Figure 10:
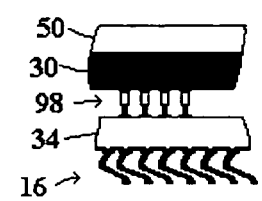
FIG. 10 shows a further alternative probe card configuration with pogo pins connecting the PCB directly to the space transformer.

Although FIGS. 3–6 also illustrate use of an interposer 32 with spring contacts, other structures than an interposer may be used to electrically connect the space transformer 34 to the PCB 30, as illustrated in FIGS. 9 and 10. FIG. 9 shows an alternative where pogo pins 94 connect the PCB 30 to the space transformer 34. The pogo pins 94 are spring loaded and provided on both sides of a substrate 96 to function similar to the interposer 32 shown in previous figures. Although shown on both sides, the pogo pins 94 can be provided on one side of the substrate 96 with other non-flexible connectors on the other side, or alternatively pogo pins can be provided in other configurations. For example, FIG. 10 shows an alternative with pogo pins 96 directly connecting the PCB 30 to the space transformer 34 without an intervening substrate.

Figure 11:
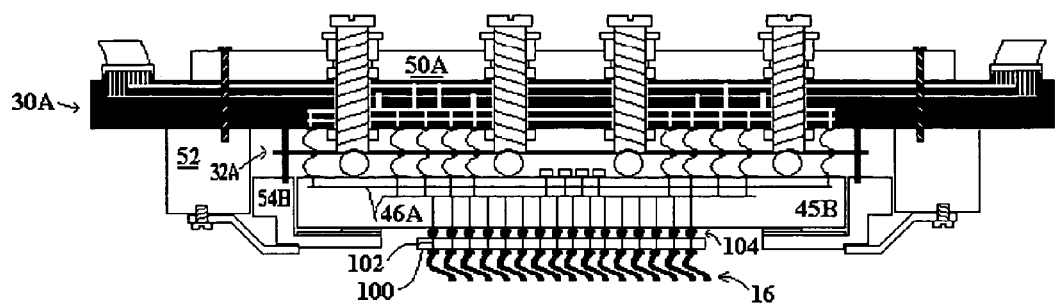
FIG. 11 shows a cross sectional view of a probe card modified from FIG. 4 to include a rigid interface tile between the probes and a lower flexural strength space transformer.

FIG. 11 illustrates the fifth modification in accordance with the present invention. The fifth modification changes the probe card structure of FIG. 4 to include a rigid interface tile 100 between the probes 16 and a lower flexural strength space transformer substrate 45B. Without the interface tile 100, "floating" contacts are created when excessive probe loading occurs, effectively pressing the probes 16 into the space transformer substrate 45B. The highly rigid interface tile 100 distributes probe loading, preventing mechanical damage to such a low flexural strength space transformer substrate. Examples of materials making up a low flexural strength space transformer substrate include organic materials, such as FR4, or a Low Temperature Co-Fired Ceramic (LTCC). An example of a higher flexural strength material for the rigid interface tile interface 100 includes a High Temperature Co-Fired Ceramic (HTCC).

The highly rigid interface tile 100 contains straight feed through vias 102 electrically connecting the probes to the space transformer. The vias 102 are attached by solder balls 104 to similar via lines in the space transformer substrate 45B. The soldering 104 further attaches the interface tile 100 to the space transformer substrate 45B. Horizontal routing is then provided in the less rigid space transformer substrate 45B by lines 46A to connect to the interposer 32A. Although use of the highly rigid interface tile 100 is shown with the probe card configuration of FIG. 4, the rigid interface tile 100 could similarly be used with the configuration of FIG. 3, or other configurations described herein.

Although the present invention has been described above with particularity, this was merely to teach one of ordinary skill in the art how to make and use the invention. Many additional modifications will fall within the scope of the invention, as that scope is defined by the following claims.

What is claimed is:

1. A probe card assembly for testing a device comprising:
a substrate with probe contacts on a first surface;
a probe card to electrically connect said probe contacts to a test system;
an electrical connection means to connect the probe contacts to the probe card; and
support means positioned against a second surface of the substrate substantially opposite said probe contacts without electrically connecting to the probe contacts, the support means transmitting probe forces introduced when the probe contacts are urged against corresponding contacts on the device being tested; and
a frame provided around a peripheral edge of the substrate, the frame including a horizontal extension extending over the surface of the substrate, wherein the probe forces are transmitted by the support means to the frame, wherein the horizontal extension of the frame includes a load support member extending vertically from a surface of the horizontal extension to engage the first surface of the substrate in an area separated from the peripheral edge of the substrate.

2. A probe card assembly for testing a device comprising:
a substrate with probe contacts on a first surface;
a probe card to electrically connect said probe contacts to a test system;
an electrical connection means to connect the probe contacts to the probe card; and
support means positioned against a second surface of the substrate substantially opposite said probe contacts without electrically connecting to the probe contacts, the support means transmitted probe forces introduced when the probe contacts are urged against corresponding contacts or the device being tested;
a frame provided around a peripheral edge of the substrate, the frame including a horizontal extension extending over the surface of the substrate, wherein the probe forces are transmitted by the support means to the frame;

a first membrane provided between a surface of the horizontal extension of the frame and the first substrate surface; and a second membrane provided between the first membrane and the substrate to engage the substrate in an area separated from the peripheral edge of the substrate.

3. A probe card assembly for testing a wafer comprising:

a substrate having a surface supporting probe contacts; and a frame provided around a peripheral edge of the substrate, the frame including a horizontal extension extending over the surface of the substrate supporting the probe contacts, the horizontal extension comprising a load support member extending vertically from a surface of the horizontal extension to engage the surface of the substrate supporting the probe contacts in an area from the peripheral edge of the substrate.

4. The probe card assembly of claim 3, wherein the load support member is machined into the frame.

5. The probe card assembly of claim 3, wherein the load support member comprises flexible membrane.

6. A probe card assembly of claim 5, wherein the flexible membrane comprises:

a first membrane provided between a surface of the horizontal extension of the frame and the substrate surface; and a second membrane provided between the first membrane and the substrate to engage the surface of the substrate supporting the probe contacts in the area separated from the peripheral edge of the substrate.

7. The probe card assembly of claim 6, wherein the first membrane and the second membrane comprise an electrically insulating material.

8. A probe card assembly of claim 3, wherein the horizontal extension extends over an area comprising 70% or more of the surface of the substrate supporting the probe contacts.

9. A probe card assembly for testing a device comprising:

a first substrate with probe contacts on a first surface, the first substrate comprising a first material;

a second substrate attached to a second surface of the first substrate, the second substrate including routing lines electrically connecting to the probe contacts, the routing lines further providing connections to a test system, the second substrate comprising a second material different than the first material;

a printed circuit board (PCB) having connectors for connecting to a test head on one side, and electrical connections provided on a second side for connecting to the routing lines of a second substrate;

an bracket fixedly connected to the PCB;

a frame provided around a peripheral edge of the second substrate, the frame including a horizontal extension extending over the first surface of the second substrate, wherein the horizontal extension comprises a load support member extending vertically from a surface of the horizontal extension to engage the surface of the second substrate supporting the probe contacts in an area separated from the peripheral edge of the second substrate; and leaf springs having a first end attached to the bracket, and a second end to engage a surface of the frame.

10. The probe card assembly of claim 9, wherein the load support member is machined the frame.

11. The probe card assembly of claim 9, wherein the load support member comprises a flexible membrane.

12. The probe card assembly of claim 9, wherein the leaf springs include bends between the first end and the second end to enable the peripheral edge of the frame to extend vertically from the bracket.

* * * * *